United States Patent [19]

Kalbitzer et al.

[11] 4,169,740
[45] Oct. 2, 1979

[54] METHOD OF DOPING A BODY OF AMORPHOUS SEMICONDUCTOR MATERIAL BY ION IMPLANTATION

[75] Inventors: Siegfried Kalbitzer; Gerhard Müller, both of Heidelberg, Fed. Rep. of Germany; Walter E. Spear; Peter G. Le Comber, both of Dundee, Scotland

[73] Assignee: Max-Planck-Gesellschaft zur Forderung der Wissenschafter e.V., Göttingen, Fed. Rep. of Germany

[21] Appl. No.: 916,065

[22] Filed: Jun. 16, 1978

[30] Foreign Application Priority Data

Dec. 20, 1977 [DE] Fed. Rep. of Germany ....... 2756861

[51] Int. Cl.$^2$ .................... H01L 21/263; H01L 45/00
[52] U.S. Cl. ..................................... 148/1.5; 148/187; 357/2; 357/91
[58] Field of Search ................... 148/1.5, 187; 357/2, 357/91

[56] References Cited

U.S. PATENT DOCUMENTS

| 3,533,857 | 10/1970 | Mayer et al. | 148/1.5 |
| 4,004,950 | 1/1977 | Baruch et al. | 148/1.5 |
| 4,064,521 | 12/1977 | Carlson | 357/2 |

OTHER PUBLICATIONS

Rehm et al., "Photo . . . of Doped Amorphous Si", Phys. Stat. vol. 79a, (1977), 539.
Anderson et al., ". . . B-Implanted Amorphous Ge . . .", Jr. Appl. Phys. 45 (1974) 4528.
Spear et al., ". . . Doped Amorphous Si and Ge", Phil. Mag. 33 (1976), 935.
Müller et al., "Doping of Amorphous Si . . .", Proc. 7th Intn. Conf. Amorphous . . . S/C, Edinburgh, Jun. 27, Jul. 1, 1977.
Müller et al., ". . . Hydrogen . . . Amorphous Si", Proc. 7th Conf. Amorphous . . . S/C. Edinburgh, Jun. 27–Jul. 1, 1977.
Hofker et al., ". . . B–Impln. in Amorphous . . . Si", Radiation Effects, 24 (1975), 223.
Dvurechensky et al., "High Dose Effects . . .", Rad. Effects, 30 (1976), 69.
Brodsky et al., "Doping of . . Amorphous S/C", IBM-TDB, vol. 19, May 1977, 4802.

Primary Examiner—L. Dewayne Rutledge
Assistant Examiner—Upendra Roy
Attorney, Agent, or Firm—Frishauf, Holtz, Goodman & Woodward

[57] ABSTRACT

To provide for effective doping and obtain substantial conductivity change in amorphous semiconductor material, typically silicon, a body of said material is raised to a temperature above about 20° C. and below the recrystallization temperature, for example in the range of between 100° C., preferably above 200°–250° C. and below about 450° C. during the ion implantation. The doping ions are, for example for silicon, of groups III and V of the periodic system, particularly boron and phosphorus. Semiconductor junctions can be made by this process by selectively doping spatially limited regions of the semiconductor body to thereby produce semiconductor components by doping with ions of different characteristics, for example of different conductivity type.

12 Claims, No Drawings

METHOD OF DOPING A BODY OF AMORPHOUS SEMICONDUCTOR MATERIAL BY ION IMPLANTATION

REFERENCE TO RELATED LITERATURE

Proceedings of the International Conference on Amorphous and Liquid Semiconductors, Edinburgh, Scotland, June 27–July 1, 1977:
(1) "On the Influence of Hydrogen on the Transport Properties of Amorphous Silicon", article by G. Muller and S. Kalbitzer; and
(2) "Doping of Amorphous Silicon by Ion Implantation", article by G. Muller, S. Kalbitzer W. E. Spear, and P. G. Le Comber.

"Optical and Electrical Properties of Boron-Implanted Amorphous Germanium Thin Films", J. Appl. Phys., Vol. 45, No. 10, October 1974, pp. 4528–4533, article by G. W. Anderson, J. E. Davey, J. Comas, N. S. Saks, and W. H. Lucke. Vol. 79, Phys. Stat. Sol. (b), 1977, page 539, article by W. Rehm, R. Fischer, J. Stuke and H. Wagner.

The present invention relates to a method of doping amorphous semiconductor material, typically silicon or germanium, by ion implantation.

BACKGROUND AND PRIOR ART

Manufacture of semiconductor components requires the selective doping of predetermined zones or regions of a body of semiconductor material. Diodes of various types, for example solar cells, transistors, integrated circuits and other semiconductor elements can be made by ion implantation. This method has become increasingly important in recent times.

An extraordinary variety of doping problems can be solved when using ion implantation in monocrystalline semiconductor material. Variations of process parameters, such as the energies of ions being implanted, the types or species of ions, the doses, the beam geometry, and the like, can be used to vary the results to be obtained.

Doping of amorphous semiconductor material has not been satisfactory heretofore since it has been impossible to achieve sufficient electrical activation of the implanted ions as donors or acceptors in the hose material. No technically useful conductivity changes could be obtained by the ion implantation process when used with amorphous semiconductor materials. It was, therefore, believed that ion implantation methods to dope amorphous semiconductor materials is not a technically suitable process. Ion implantation has been carried out at room temperature—approximately 20° C.—and much below this temperature; the referenced publication by Rehm et al., for example, notes that the effect of phosphorus ion implantation in amorphous silicon at a temperature of 80° K. disappeared after annealing of the semiconductor silicon body at about 200° C. It was inferred that the originally observed change in conductivity was based principally on the radiation effects. Amorphous germanium which, in its properties, is closely related to or resembles silicon, has been used as a basis for ion implantation—see the referenced article by Anderson et al. Implantation of boron ions was attempted and it was noted that the increase in conductivity was at most by a factor of 40 without, however, significant displacement of the Fermi level.

The Invention

It is an object to provide an ion implantation process in which substantial conductivity changes can be obtained by ion implantation of doping materials in amorphous semiconductor base materials.

Briefly, and contrary to prior art processes, the ion implantation step is carried out when the body of semiconductor material is at an elevated temperature, that is, above room temperature, but below the recrystallization temperature thereof. Typically, the ion bombardment of the semiconductor body is carried out at a temperature of over about 100° C., and for silicon preferably at over about 200° C., for example at over about 250° C. The upper limit of temperature which is suitable for silicon is about 450° C.

It has been found, surprisingly, that by "hot implantation" of ions, doping of amorphous semiconductor materials, particularly amorphous silicon and amorphous germanium becomes possible. The semiconductor body is held at a temperature which is considerably above the temperatures previously used during the ion bombardment step. In the prior processes, the body of amorphous semiconductor material to be doped in the form of a layer was held, during doping, at a temperature which was significantly below room temperature. "Room temperature" as used herein is defined as about 20° C. In contrast to the prior art processes, the present invention teaches that the amorphous semiconductor material is placed at a temperature much above room temperature during the ion bombardment. Particularly when doping amorphous silicon, temperatures of about 250° C. and over are suitable. The temperature, of course, should be not so high as to influence the desired amorphous structure of the semiconductor material. In the case of amorphous silicon, the temperature should remain appreciably below the recrystallization temperature which is about 630° C., and a temperature below approximately 450° C. and preferably below 400° C. is desirable. As the temperature is increased, a certain degree of diffusion of the implanted dopants takes place in the semiconductor material, so that the most appropriate upper temperature level during which the process is carried out is preferably several hundred degrees C below the recrystallization temperature of the semiconductor body. The exact temperature relationships can be determined by the specific use to which the doped semiconductor body is to be put and may vary within the above limits in accordance with design requirements.

The process permits changes in conductivity level greater than ten orders of magnitude, and a displacement of the Fermi level of about 1.2 eV.

Basic Process

A semiconductor body to be doped, typically amorphous silicon, is placed on a carrier which can be heated to a controlled temperature and located in a vacuum chamber of ion implantation apparatus of known and usual type. If desired, the semiconductor body can be produced in the same vacuum chamber in which it is to be doped and, after production, can be directly doped by ion implantation without breaking the vacuum of the vacuum chamber.

Particularly good results are obtained with high resistance, that is, high-ohmic amorphous silicon, produced by glow discharge. The resulting amorphous silicon then will have a relatively low density of states within the band gap, as is well known.

The process can be used with various types of base semiconductors: They may be homogeneous undoped; they may be homogeneous doped; they may be non-homogeneous bodies predoped during manufacture, for example in layers. All these bodies can be doped by the process in spatially selected arrangements, for example by masking or specific direction of an ion implantation beam at geometrically defined regions as well known in ion implantation technology in general. The basic conditions for the manufacture of electronic components from amorphous semiconductor bodies, particularly amorphous silicon, are thereby provided.

Various types of semiconductor elements can be produced by the process, having various types of junctions, for example: pn, n+n, p+p, p+n, npn. Single or multiple implantation of ions of a desired characteristic, e.g. for silicon typically boron and phosphorus, or other suitable elements, as well known in semiconductor technology may be used. Thus, ions of different characteristics can be applied to spatially different regions or layers. The steps may be carried out sequentially for process convenience, but this does not appear to be a necessary condition.

The ions may be implanted with the usual energies, that is, energies in the kilo-electron Volt region, and with the usual radiation beam currents.

The present invention is suitable for the doping of amorphous elemental semiconductor materials, and most typically silicon and germanium.

EXAMPLE 1

A semiconductor layer of amorphous silicon of approximately 0.1 microns thickness and 1 cm$^2$ size was placed in a vacuum of $10^{-5}$ torr or better on a substrate and heated to a temperature of 300° C. Ion implantation was obtained by means of a beam of phosphorus ions with an average ion current of 3 $\mu$A at several energies in the interval of 20–60 keV directed on the layer for a total time of 500 seconds. The room temperature conductivity of the amorphous silicon was increased in this way from $10^{-9}$ (Ohm-cm)$^{-1}$ to $10^{-2}$ (Ohm-cm)$^{-1}$.

EXAMPLE 2

An n-type semiconductor layer of amorphous silicon of approximately 0.5 microns thickness and 1 cm$^2$ size was placed in a vacuum of $10^{-5}$ torr or better on a substrate and heated to a temperature of 250° C. Ion implantation was obtained by means of a beam of boron ions with an average ion current of 3 $\mu$A at several energies in the interval of 7–50 keV directed on the layer for a total time of 2000 seconds. The conductivity of the implanted region of the amorphous film was changed in this way from n-type to p-type, forming a p-n junction at the interface having under illumination with sunlight an open circuit voltage greater than 0.5 V.

We claim:

1. Method of doping a body of amorphous semiconductor material by ion implantation comprising the steps of
   providing a body of amorphous semiconductor material;
   and bombarding said body by accelerated ions of a predetermined doping material and
   wherein, in accordance with the invention, while the bombarding step is carried out the method includes the step of
   heating said body to a temperature which is above a temperature of about 20° C. and below the recrystallization temperature of the body of amorphous semiconductor material.

2. Method according to claim 1, wherein, during the ion bombardment, the heating step comprises maintaining the semiconductor body at a temperature of over about 100° C.

3. Method according to claim 1, wherein, during the ion bombardment, the heating step comprises maintaining the semiconductor at a temperature of over about 200° C.

4. Method according to claim 1, wherein, during the ion bombardment, the heating step comprises holding the semiconductor body at a temperature of over about 250° C.

5. Method according to claim 2, 3 or 4, wherein, during the ion bombardment, the heating step comprises holding the semiconductor body at a temperature of below about 450° C.

6. Method according to claim 1, wherein the semiconductor body is an amorphous elemental semiconductor.

7. Method according to claim 6, wherein the semiconductor body is silicon.

8. Method according to claim 7, wherein the doping ions comprise ions of an element of the main groups III and V of the periodic system.

9. Method according to claim 7, wherein the doping ions comprise ions of at least one of: boron; phosphorus.

10. Method according to claim 1, wherein the ion implantation step comprises selective doping of spatially defined regions of the semiconductor body to produce a semiconductor component.

11. Method to produce a semiconductor junction by ion implantation in a body of semiconductor material comprising
    carrying out the ion implantation method steps of claim 1 over a spatially defined region of the semiconductor body with ions of a first doping material;
    and further carrying out the method steps of claim 1 with respect to the same region or to a spatially adjacent region of the semiconductor body with ions of another doping material.

12. Method to produce a semiconductor junction by ion implantation in a body of semiconductor material comprising
    carrying out the ion implantation method steps of claim 1 over a spatially defined region of the semiconductor body with ions of a first doping material, to form one ion implantation step cycle;
    and further carrying out the method steps of claim 1 in an additional step cycle with respect to the same region or to a spatially adjacent region of the semiconductor body with ions of a characteristic different from those used for implantation in said one step cycle.

* * * * *